(12) United States Patent
Hong et al.

(10) Patent No.: US 11,018,408 B2
(45) Date of Patent: May 25, 2021

(54) ANTENNA APPARATUS IN WIRELESS COMMUNICATION DEVICE

(71) Applicant: Samsung Electronics Co., Ltd., Gyeonggi-do (KR)

(72) Inventors: Won-Bin Hong, Seoul (KR); Kwang-Hyun Baek, Anseong-si (KR); Sang-Ho Lee, Seongnam-si (KR); Joon-Young Choi, Hwaseong-si (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 391 days.

(21) Appl. No.: 15/323,918

(22) PCT Filed: Jul. 3, 2015

(86) PCT No.: PCT/KR2015/006880
§ 371 (c)(1),
(2) Date: Jan. 4, 2017

(87) PCT Pub. No.: WO2016/003237
PCT Pub. Date: Jan. 7, 2016

(65) Prior Publication Data
US 2017/0155185 A1    Jun. 1, 2017

(30) Foreign Application Priority Data
Jul. 4, 2014 (KR) .................. 10-2014-0083575

(51) Int. Cl.
*H01Q 1/38* (2006.01)
*H01Q 1/22* (2006.01)
(Continued)

(52) U.S. Cl.
CPC ............ *H01Q 1/2283* (2013.01); *H01Q 1/24* (2013.01); *H01Q 1/242* (2013.01); *H01Q 1/243* (2013.01);
(Continued)

(58) Field of Classification Search
CPC ............ H01Q 1/242; H01Q 1/38; H01Q 1/24; H01Q 1/243; H01Q 7/00; H01Q 9/42
See application file for complete search history.

(56) References Cited

U.S. PATENT DOCUMENTS 5,767,810 A * 6/1998 Hagiwara ............ H01Q 9/0421
343/700 MS
5,777,526 A   7/1998 Kawasaki
(Continued)

FOREIGN PATENT DOCUMENTS

CN    101510630 A    8/2009
JP    H0878940 A    3/1996
(Continued)

OTHER PUBLICATIONS

Supplementary Partial European Search Report dated Feb. 2, 2018 in connection with European Patent Application No. 15 81 4686.
(Continued)

*Primary Examiner* — Dieu Hien T Duong

(57) ABSTRACT

The present disclosure relates to a pre-5th-Generation (5G) or 5G communication system to be provided for supporting higher data rates Beyond 4th-Generation (4G) communication system such as Long Term Evolution (LTE). An apparatus comprising an antenna includes a board having a stack structure, wherein the board comprises a first layer and a second layer, and at least one radiating unit disposed between the first layer and the second layer. Further, the present invention also includes embodiments different from the above-described embodiment.

10 Claims, 26 Drawing Sheets

(51) Int. Cl.
*H01Q 1/24* (2006.01)
*H01Q 15/00* (2006.01)
*H01Q 9/04* (2006.01)
*H01Q 7/00* (2006.01)
*H01Q 9/42* (2006.01)

(52) U.S. Cl.
CPC ............... *H01Q 1/38* (2013.01); *H01Q 7/00* (2013.01); *H01Q 9/0421* (2013.01); *H01Q 9/42* (2013.01); *H01Q 15/0086* (2013.01); *H01L 2224/16225* (2013.01)

(56) References Cited

U.S. PATENT DOCUMENTS

| | | | |
|---|---|---|---|
| 5,777,581 A * | 7/1998 | Lilly | H01Q 1/38 333/33 |
| 7,061,431 B1 * | 6/2006 | Tonn | H01Q 9/0407 343/700 MS |
| 7,518,229 B2 | 4/2009 | Cotte et al. | |
| 7,675,465 B2 | 3/2010 | Doan et al. | |
| 7,728,774 B2 | 6/2010 | Akkermans et al. | |
| 7,808,798 B2 | 10/2010 | Cotte et al. | |
| 7,884,778 B2 | 2/2011 | Wu et al. | |
| 9,337,526 B2 | 5/2016 | Hong et al. | |
| 2002/0171591 A1 | 11/2002 | Beard | |
| 2004/0104852 A1 | 6/2004 | Choi et al. | |
| 2004/0246180 A1 | 12/2004 | Okado | |
| 2005/0200527 A1 | 9/2005 | Habbib et al. | |
| 2008/0001843 A1 | 1/2008 | Wu et al. | |
| 2009/0231225 A1 * | 9/2009 | Choudhury | H01Q 3/26 343/770 |
| 2009/0278746 A1 * | 11/2009 | Aurinsalo | H01Q 9/0435 343/700 MS |
| 2010/0277374 A1 | 11/2010 | Ju et al. | |
| 2011/0199281 A1 * | 8/2011 | Morton | H01Q 1/42 343/872 |
| 2012/0212395 A1 * | 8/2012 | Sanada | H01Q 15/0086 343/912 |
| 2013/0099006 A1 | 4/2013 | Hong et al. | |
| 2014/0110841 A1 | 4/2014 | Beer et al. | |
| 2014/0145883 A1 * | 5/2014 | Baks | H01Q 1/2283 343/700 MS |
| 2014/0184460 A1 | 7/2014 | Yen | |
| 2015/0249283 A1 * | 9/2015 | Watanabe | H01Q 1/24 343/702 |

FOREIGN PATENT DOCUMENTS

| | | | |
|---|---|---|---|
| JP | H09191212 A | | 7/1997 |
| JP | 2002158529 A | | 5/2002 |
| JP | 2007243448 A | * | 9/2007 |
| KR | 20070015931 A | | 2/2007 |
| KR | 10-0733679 B1 | | 6/2007 |
| KR | 0733679 B1 | | 6/2007 |
| KR | 10-1014347 B1 | | 2/2011 |
| KR | 10104347 B1 | | 2/2011 |
| KR | 10-2013-0042909 A | | 4/2013 |
| TW | 200803048 A | | 1/2008 |

OTHER PUBLICATIONS

Office Action dated Sep. 21, 2018 in connection with Chinese Patent Application No. 201580035270.9, 14 pages.
Extended European Search Report regarding Application No. 15814686.0, dated Jun. 11, 2018, 10 pages.
Communication pursuant to Article 94(3) EPC dated Mar. 13, 2019 in connection with European Patent Application No. 15 814 686.0, 7 pages.
Office Action dated Jun. 5, 2019 in connection with Chinese Patent Application No. 201580035270.9, 10 pages.
Office Action dated Oct. 8, 2019 in connection with Chinese Patent Application No. 201580035270.9, 11 pages.
Communication pursuant to Article 94(3) EPC dated Nov. 22, 2019 in connection with European Application Patent No. 15 814 686.0, 7 pages.
Notice of Preliminary Rejection in connection with Korean Application No. 10-2014-0083575 dated Jan. 10, 2020, 13 pages.
Examination Report in connection with Indian Application No. 201637043981 dated Jan. 29, 2020, 7 pages.
Notice of Preliminary Rejection in connection with Korean Application No. 10-2014-0083575 dated Jun. 17, 2020, 15 pages.

* cited by examiner

⇒ : POLARIZATION ORIENTATION

ANTENNA APPARATUS IN WIRELESS COMMUNICATION DEVICE

CROSS-REFERENCE TO RELATED APPLICATIONS AND CLAIM OF PRIORITY

The present application claims priority under 35 U.S.C. § 365 to International Patent Application No. PCT/KR2015/006880, which was filed on Jul. 3, 2015, and claims a priority to Korean Patent Application 10-2014-0083575, which was filed on Jul. 4, 2014, each of which are incorporated herein by reference into the present disclosure as if fully set forth herein.

TECHNICAL FIELD

The present invention relates to an antenna for a wireless communication device.

BACKGROUND ART

To satisfy a wireless data traffic demand which is growing after a 4th generation (4G) communication system is commercialized, efforts are exerted to develop an advanced 5th generation (5G) communication system or a pre-5G communication system. In this regard, the 5G communication system or the pre-5G communication system is referred to as a beyond 4G network communication system or a post Long Term Evolution (LTE) system.

To achieve a high data rate, the 5G communication system considers its realization in an extremely high frequency (mm Wave) band (e.g., 60 GHz band). To mitigate a path loss of propagation in the extremely high frequency band and to extend a propagation distance, the 5G communication system is discussing beamforming, massive Multiple Input Multiple Output (MIMO), Full Dimensional (FD)-MIMO, array antenna, analog beam-forming, and large scale antenna techniques.

Also, for network enhancement of the system, the 5G communication system is developing techniques such as an evolved small cell, an advanced small cell, a cloud Radio Access Network (RAN), an ultra-dense network, a Device to Device (D2D) communication, a wireless backhaul, a moving network, cooperative communication, Coordinated Multi-Points (CoMP), and interference cancellation.

Besides, the 5G system is working on hybrid Frequency Shift Keying (FSK) and Quadrature Amplitude Modulation (QAM) Modulation (FQAM) and Sliding Window Superposition Coding (SWSC) as Advanced Coding Modulation (ACM), and Filter Bank Multi Carrier (FBMC), Non Orthogonal Multiple Access (NOMA), and Sparse Code Multiple Access (SCMA) as advanced access technologies.

Further, thanks to technological advances, communication devices are getting smaller, and various electronic devices provide network-based services using the communication device. Thus, not only a portable terminal (e.g., a cellular phone, a smart phone, etc.) initially developed for the communications but also conventional devices not having the communication function provide various services using the communication. In so doing, it is general to apply a wireless communication technology to facilitate portability and to avoid inconvenience of wired communication.

For the wireless communication, an antenna for signal radiation is necessarily included. To send a signal via the antenna, a communication device generates a baseband signal from transmit data, generates a Radio Frequency (RF) signal using an RF Integrated Circuit (RFIC), and then radiates the signal via the antenna. Also, the communication device may receive a signal via the antenna.

Typically, the antenna and the RFIC form a three-layer structure together with a circuit board. In other words, the antenna, the RFIC, and the circuit board may be assembled as an antenna package of the three-layer structure. This is because the antenna, the RFIC, and the circuit board go through individual design and process in order to achieve their performance respectively. In particular, to achieve performance for high-frequency band communication, the antenna, the RFIC, and the circuit board generally go through individual design and process. Accordingly, in a final assembling process, the antenna is first bonded with the RFIC through a surface mount process such as flip-chip bonding, wire bonding. Next, the combined antenna-RFIC assembly is coupled with the circuit board using a Surface Mount Technology (SMT) such as Ball Grid Array (BGA), Land Grid Array (LGA).

As stated above, the antenna, the RFIC, and the circuit board are fabricated as the individual components and then assembled. As a result, when the communication device is manufactured, an additional assembling process for the antenna package is required and a greater cost is incurred for the assembling.

DISCLOSURE OF INVENTION

Technical Problem

One embodiment of the present invention provides an antenna apparatus of a structure for reducing an antenna package manufacturing cost in a communication device.

Another embodiment of the present invention provides an antenna apparatus embedded in a board in a communication device.

Yet another embodiment of the present invention provides an antenna apparatus which blocks influence from an outside contact in a communication device.

Still embodiment of the present invention provides an antenna apparatus for enhancing board space efficiency in a communication device.

A further embodiment of the present invention provides an antenna apparatus for reducing a transition loss in a communication device.

Solution to Problem

An apparatus including an antenna according to an embodiment of the present invention includes a board having a stack structure including a first layer and a second layer, and at least one antenna radiator disposed between the first layer and the second layer.

Advantageous Effects of Invention

Since an antenna is disposed inside a board in a wireless communication device, an outer surface of the board where the antenna is mostly mounted may be used for other purpose and antenna performance degradation due to outside contact may be prevented.

BEST MODE FOR CARRYING OUT THE INVENTION

Hereinafter, an operational principle of the present invention is described in detail with reference to the accompanying drawings. In the following explanations, well-known functions or constitutions will not be described in detail if they would unnecessarily obscure the subject matter of the present invention. Also, terminologies to be described below are defined in consideration of functions in the present invention and may vary depending on a user's or an operator's intention or practice. Thus, their definitions should be defined based on all the contents of the specification.

Hereinafter, the present invention describes a technique for signal radiation in a wireless communication device. Terms indicating components of an antenna and terms describing radio wave characteristics in the following explanations are used to ease the understanding. Accordingly, the present invention is not limited to those terms and may adopt other terms having technically equivalent meanings.

In the present invention, the wireless communication device may be a portable electronic device, and may be a communication means included in one of a smart phone, a portable terminal, a mobile phone, a mobile pad, a media player, a tablet computer, a handheld computer, or a Personal Digital Assistant (PDA). Alternatively, the wireless communication device may be a component (e.g., a probe of an ultrasonograph) of a medical device. Also, the wireless communication device may be a communication means for an apparatus which combines two or more functions of those devices.

Figure 1:
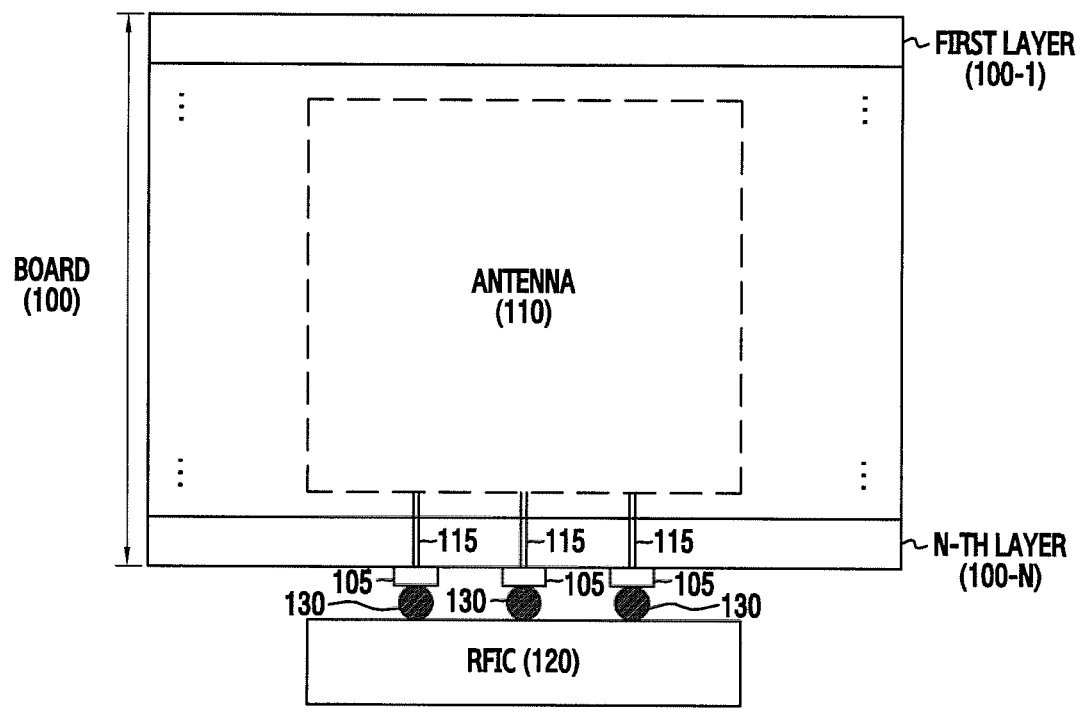
FIG. 1 illustrates a structure of an antenna package in a wireless communication device according to an embodiment of the present invention.

FIG. 1 illustrates a structure of an antenna package in a wireless communication device according to an embodiment of the present invention.

Referring to FIG. 1, the antenna package includes a board 100, an antenna 110, and a Radio Frequency Integrated Circuit (RFIC) 120.

The antenna 110 indicates a conductive material designed in a certain shape, and includes at least one antenna pattern for signal radiation, a feedline for delivering a signal to the at least one antenna pattern, and a ground. The at least one antenna pattern may be designed in an appropriate structure for radio signal radiation. The antenna pattern may be referred to as a radiating unit. The feedline may have a stripline structure or a microstrip structure, or an embedded coplanar waveguide line structure.

The board 100 is a set of planar dielectrics or insulators, and includes N-ary layers. That is, the board 100 has a stack layer including a plurality of layers. The board 100 has a structure electrically separated from and structurally supported by dielectric layers stacked with a plurality of conductive plates. The board 100 is a component which may implement electrical connections between electronic components with high density, low cost, high reliability, and high productivity. For example, the board 100 may include a Printed Circuit Board (PCB). According to an embodiment of the present invention, the board 100 may have a structure where the antenna 110 and signal wiring for wireless communication are embedded. Accordingly, separate fabrication of the antenna 110 and an assembling process such as Ball Grid Array (BGA), Land Grid Array (LGA) used when assembling the board 110 and the antenna 110 may be omitted. Further, a physical distance between the antenna 110 and the board 100 may be reduced. In other words, various embodiments of the present invention improve high-frequency performance by placing the antenna 110 inside the board 100, and reduce the size of the antenna package. In addition, pads 105 for bonding the RFIC 120 is further included below the board 100.

The RFIC 120 is a circuit for generating an RF signal to radiate via the antenna 110. The RFIC 120 may be bonded to the board 100 using flip-chip bonding or wire bonding. The RFIC 120 is connected to signal lines 115 of the antenna 110 through at least one ball 130. The signal line 115 indicates an electrical connecting means for feeding a signal to at least one radiating unit in the antenna 100, and may be referred to as a 'feedline' or a 'feed unit'. The signal line 115 may provide a signal from the RFIC 120 to the antenna 110 according to a direct feed method or a coupling feed method.

Although not illustrated in FIG. 1, a power line for supplying power to the RFIC 120 may be formed inside the board 100. A conductive via for electrically connecting the power line with any one of the pads 105 for bonding the RFIC 120 and may be formed.

According to various embodiments of the present invention, the antenna 110 is included inside the board 100. That is, the antenna 110 including at least one antenna pattern is disposed between two different layers, that is, between a first layer and a second layer of the board 100. Specifically, the antenna 110 is disposed within a second layer through an (N−1)-th layer excluding a first layer 100-1 which is the highest layer and an N-th layer 100-N which is the lowest layer of the board 100. Herein, the first layer 100-1 which is the highest layer may be referred to as the 'highest layer', the N-th layer 100-N which is the lowest layer may be referred to as the 'lowest layer', and the second layer through the (N−1)-th layer may be referred to as intermediate layers.

Figure 2A:
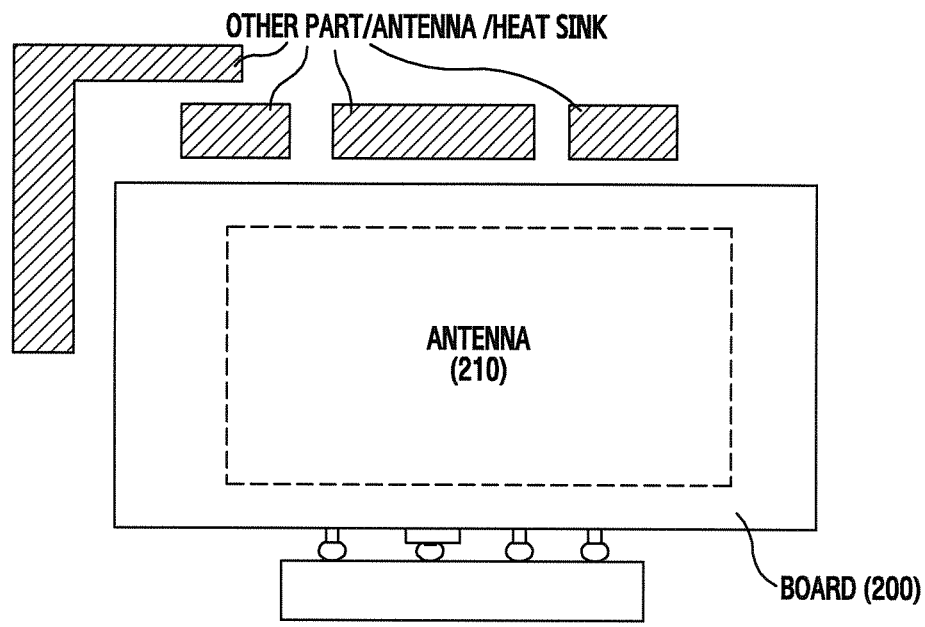
FIGS. 2A to 2C illustrate an example of an utilization of a upper space of a board in a wireless communication device according to an embodiment of the present invention.
Figure 2B:
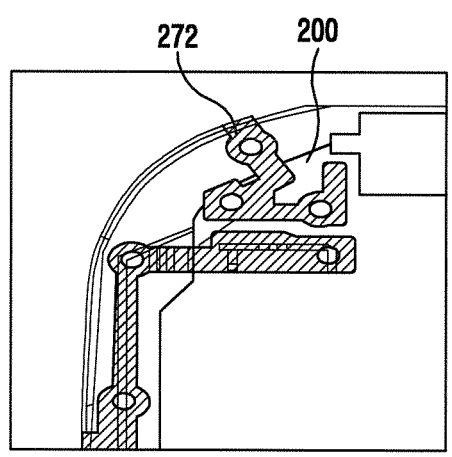
Figure 2C:
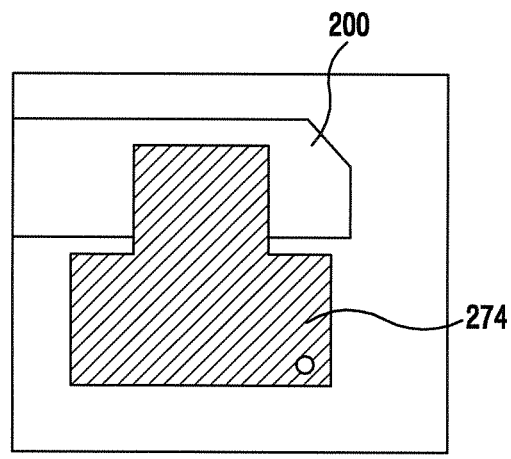

Thanks to the structure of FIG. 1, performance may be maximized with a smaller number of the antennas. Further, the antenna package structure as shown in FIG. 1 may reduce mass production cost. In addition, on account of the structure of FIG. 1, a surface of the board 100 where the antenna is disposed in the prior art may be used for other use. For example, an utilization as shown as FIGS. 2A to 2C is feasible. FIGS. 2A to 2C illustrate an example of an utilization of a upper space of a board in a wireless communication device according to an embodiment of the present invention.

Referring to FIG. 2A, an antenna 210 is disposed inside a board 200. Hence, an antenna of a different band, other component, and a heat sink may be disposed on an upper surface of the board 200. Specifically, as shown in FIG. 2B, the antenna of the different band (e.g., a Global Positioning System (GPS) antenna) 272 may be disposed at the top of the board 200. Although the antenna 272 of the different band is disposed at the top of the board 200, a sufficient spacing may be secured because the antenna 210 is disposed inside the board 200. Also, as shown in FIG. 2C, a heat sink 274 may be disposed at the top of the board 210. Thus, space efficiency may be increased.

Figure 3A:
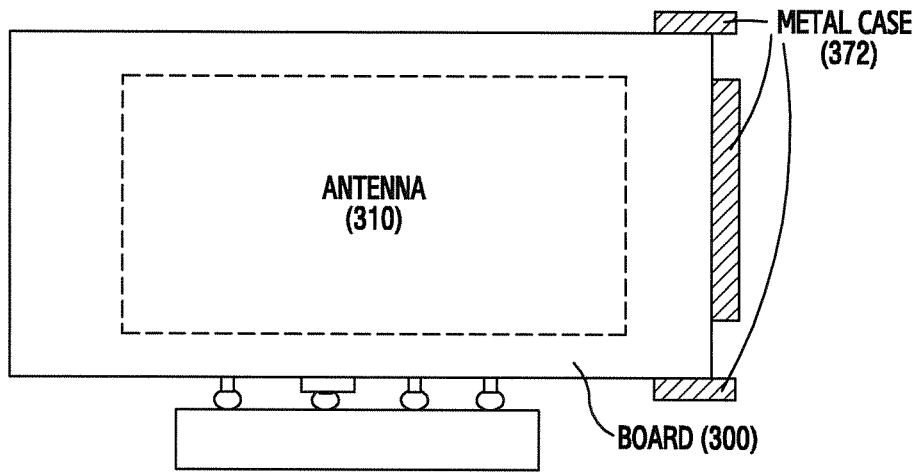
FIGS. 3A and 3B illustrate an example of an utilization of a metal case in a wireless communication device according to an embodiment of the present invention.
Figure 3B:
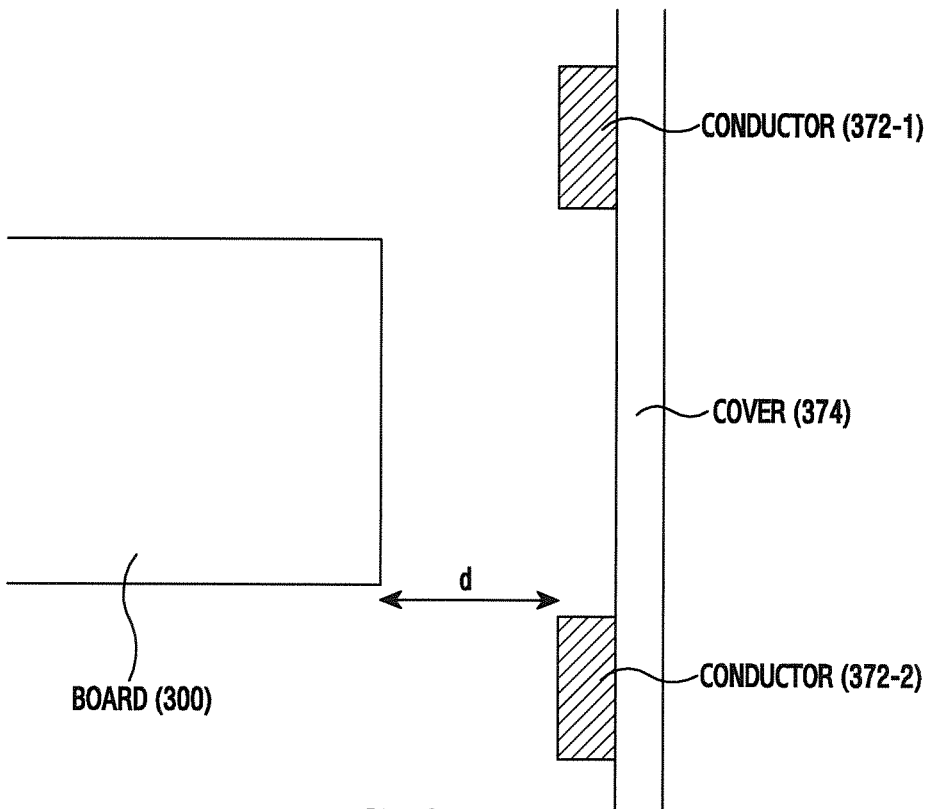

FIGS. 3A and 3B illustrate an example of an utilization of a metal case in a wireless communication device according to an embodiment of the present invention.

As shown in FIG. 3A, a metal case 373 may be disposed adjacent to a board 300 including an antenna 310. The metal case 372 may improve an antenna gain. For example, the metal case 372 may function as a substrate with a high dielectric layer. In other words, when a signal of the antenna 310 is radiated to the right toward the metal case 372, the metal case 372 may increase signal directivity. Referring to FIG. 3B, a cover 374 of a communication device is spaced a distance d apart from the board including the antenna. For example, the distance d may be 2 mm. Conductors 372-1 and 372-2 corresponding to the metal case 372 may be disposed on an inner surface of the cover 374. A change amount of the directivity may vary depending on a size of the distance d.

Figure 4:
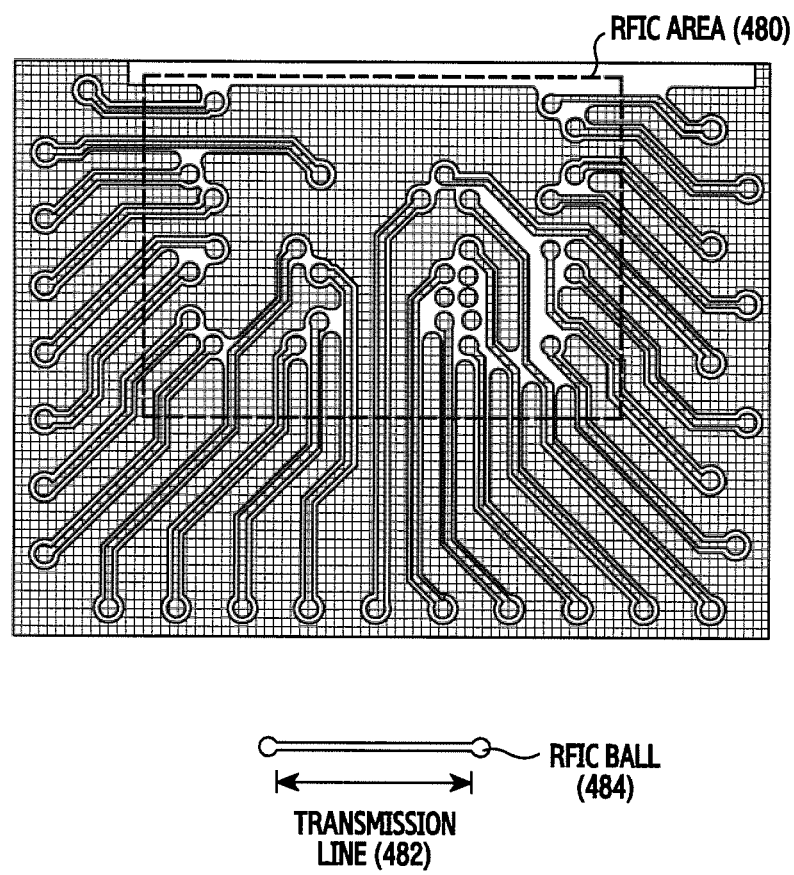
FIG. 4 illustrates an example of a ball map in a wireless communication device according to an embodiment of the present invention.

An antenna package according to the prior art requires patterning up to board edges and increases a transition loss. However, the antenna package according to various embodiments of the present invention may maximize utilization of the embedded robust antenna including the metal component and the ground of the lower layer. For example, an area for installing the RFIC on the board is shown in FIG. 4. FIG. 4 illustrates an example of a ball map in a wireless communication device according to an embodiment of the present invention. FIG. 4 shows a plurality of transmission paths, each transmission path includes a transmission line 482, and an end of the transmission line includes an RFIC ball 484. As shown in FIG. 4, an RFIC area 480 lies in a certain area at the top of the board. The embedded antenna according to an embodiment of the present invention may reduce a length of each transmission path. That is, according to an embodiment of the present invention, mounting and interconnection may be enhanced. In other words, a path length between an input ball of the RFIC and the antenna is shortened, the transition loss may be reduced.

Hereafter, specific embodiments of the antenna embedded structure of the present invention are described with the drawings.

Figure 5:
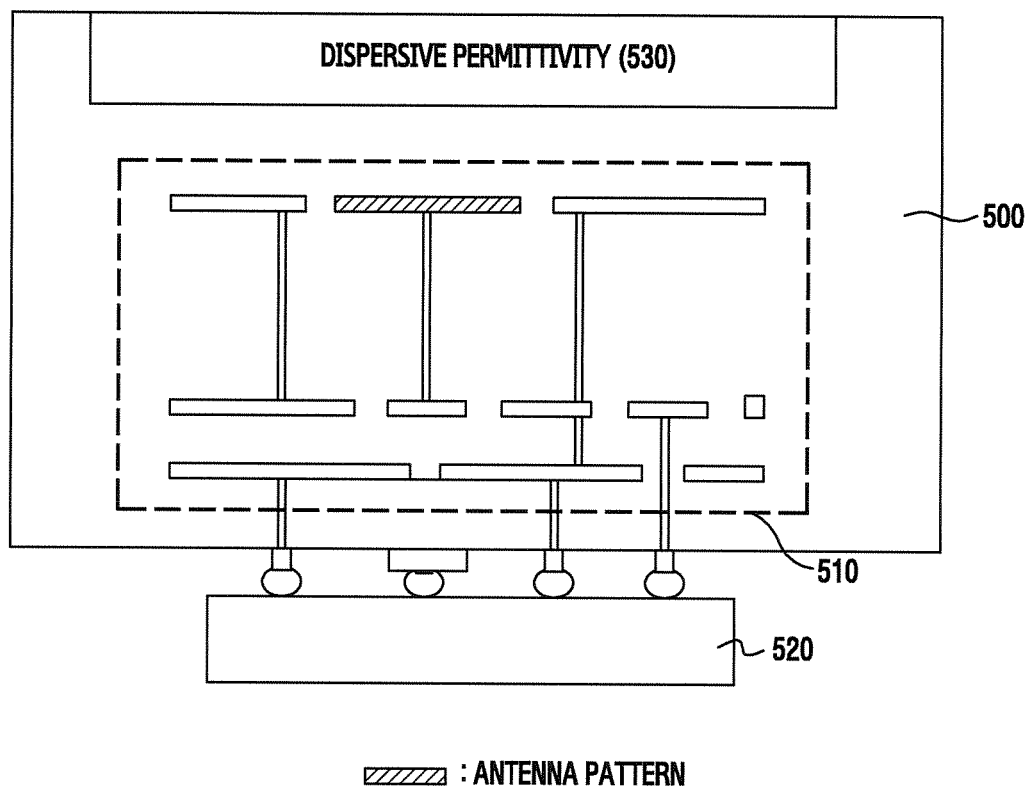
FIG. 5 illustrates an antenna package using dispersive permittivity in a wireless communication device according to an embodiment of the present invention.

FIG. 5 illustrates an antenna package using dispersive permittivity in a wireless communication device according to an embodiment of the present invention.

Referring to FIG. 5, the antenna package includes a board 500, an antenna 510, and an RFIC 520, the antenna 510 is embedded in the board 500, and a partial area of the top layer of the board 500 includes a dispersive dielectric 530. The dispersive dielectric 530 have different permittivity from the board 500. Thanks to the dispersive dielectric 530, a superstrate or lenz structure may be realized. That is, the dispersive dielectric 530 may enhance high gain and beam shaping.

Figure 6:
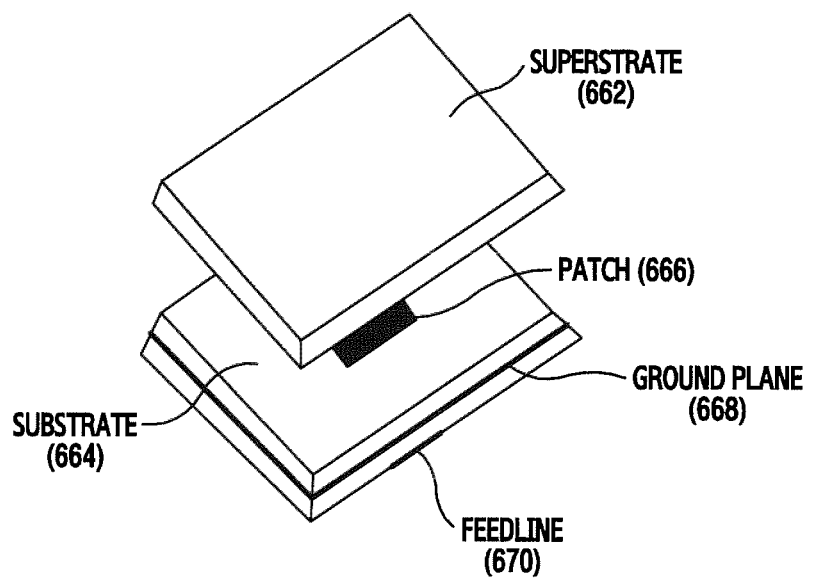
FIG. 6 illustrates an antenna equivalent structure with a superstrate and a substrate in a wireless communication device according to an embodiment of the present invention.

FIG. 6 illustrates an antenna equivalent structure with a superstrate and a substrate in a wireless communication device according to an embodiment of the present invention. Referring to FIG. 6, a patch 636 lies between a superstrate 662 and a substrate 664. The substrate 664 includes a ground plane 668 and a feedline 670. The superstrate 662 corresponds to the dispersive dielectric 530, the substrate 664 corresponds to the board 500, and the patch 636, the ground plane 668, and the feedline 670 correspond to the antenna 510. The prior art requires a separate space for stacking the substrate 664, the patch 636, and the superstrate 662. However, in the embodiment of the present invention, since the antenna 510 is embedded in the board 500, the structure of FIG. 6 may be realized in a smaller space by replacing part of the top of the board 500 with other material.

Figure 7:
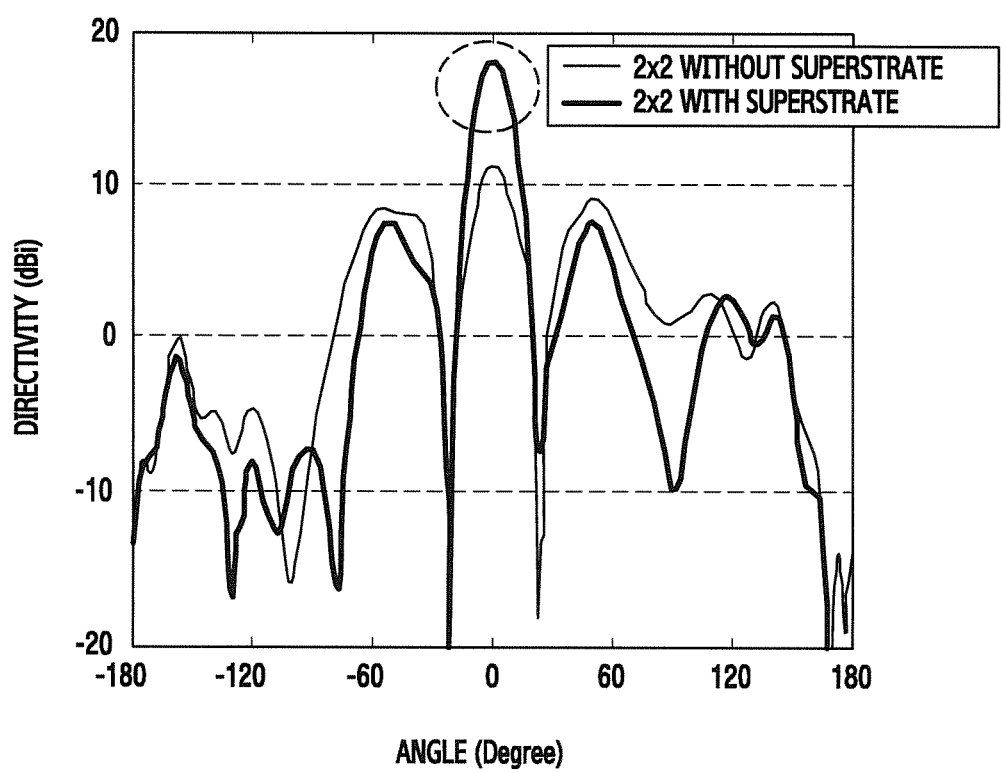
FIG. 7 illustrates performance of a superstrate in a wireless communication device according to an embodiment of the present invention.

Performance in the superstrate structure changes as shown in FIG. 7. FIG. 7 illustrates performance of a superstrate in a wireless communication device according to an embodiment of the present invention. Referring to FIG. 7, with the superstrate, directivity for 0° is improved.

Figure 8:
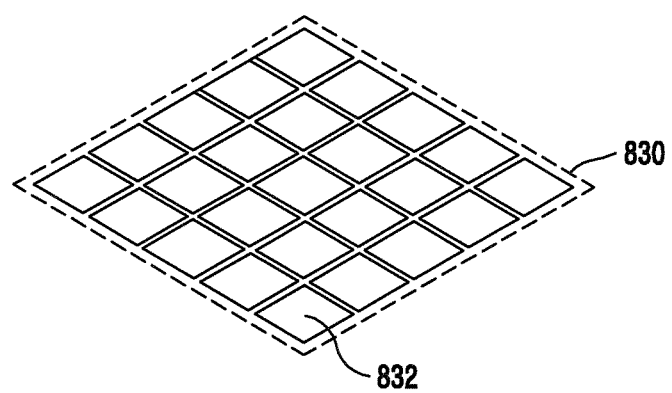
FIG. 8 illustrates an example of an implementation of dispersive permittivity in a wireless communication device according to an embodiment of the present invention.

The dispersive dielectric 530 may be implemented in various structures. For example, the dispersive dielectric 530 may be implemented in a periodic structure. FIG. 8 illustrates an example of an implementation of dispersive permittivity in a wireless communication device according to an embodiment of the present invention. Referring to FIG. 8, dispersive permittivity 830 may be realized in a periodic structure including a plurality of unit cells 832. The unit cell 832 has a resonant frequency, and a beam pattern may be controlled by the dispersive permittivity 830 according to a change of the resonant frequency. For example, the unit cell 832 may include a passive element controllable. Specifically, the unit cells 832 may realize metal patterning in a particular shape at the top or the bottom of the dielectric. The particular metal patterning formed may be realized by arranging the unit cells 832 in a certain direction (e.g., x axis, y axis, both directions) at certain intervals. The metal patterning may have characteristics of a Composite Right/Left-Hand (CRLH) material or a parallel RLC, that is, a Right-Hand (RH) material in a particular frequency band in terms of an equivalent circuit. Herein, the interval may have a fixed value smaller than a wavelength of an operating frequency.

Figure 9:
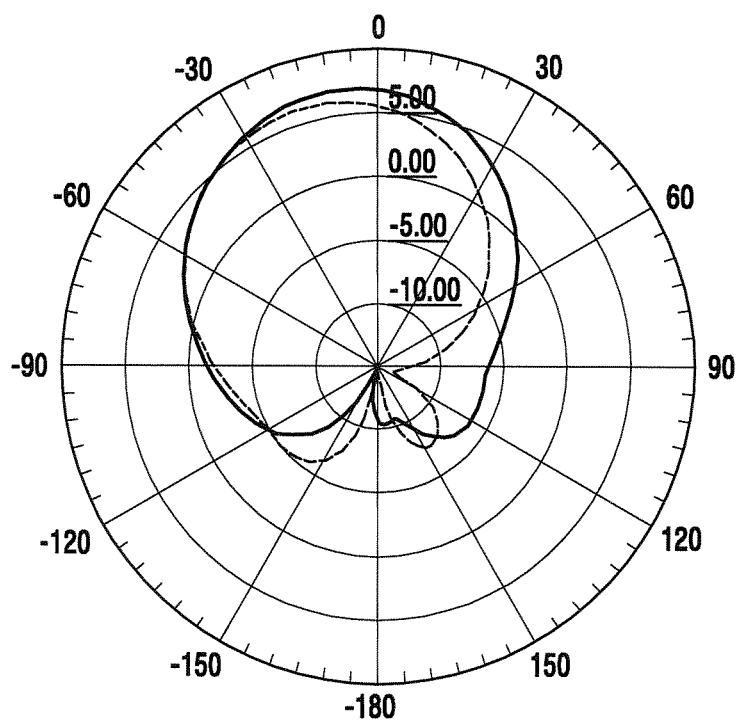
FIG. 9 illustrates gain improvement due to dispersive permittivity in a wireless communication device according to an embodiment of the present invention.
Figure 10:
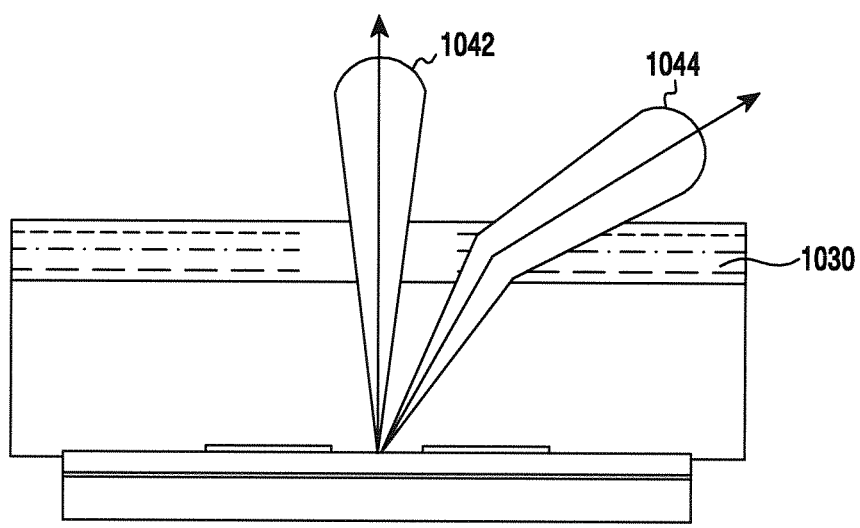
FIG. 10 illustrates a lenz effect due to dispersive permittivity in a wireless communication device according to an embodiment of the present invention.
Figure 11:
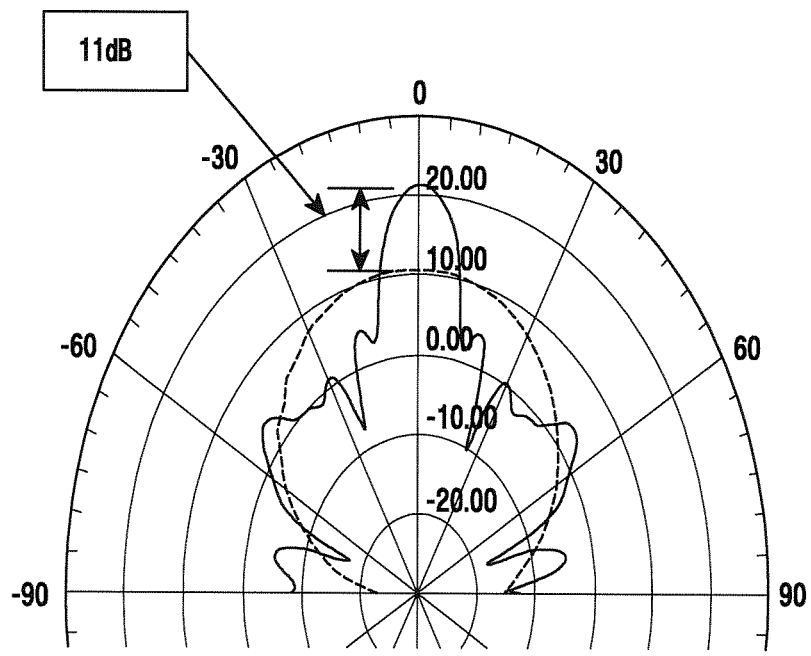
FIG. 11 illustrates beam characteristic change due to a lenz effect in a wireless communication device according to an embodiment of the present invention.

Performance enhancement based on the dispersive permittivity 530 is shown in FIG. 9. FIG. 9 illustrates gain improvement due to dispersive permittivity in a wireless communication device according to an embodiment of the present invention. Referring to FIG. 9, when the dispersive permittivity 530 is disposed at the top of the antenna, the gain is improved in most directions. Also, the lenz effect due to the dispersive permittivity 530 is shown in FIG. 10. FIG. 10 illustrates a lenz effect due to dispersive permittivity in a wireless communication device according to an embodiment of the present invention. Referring to FIG. 10, refraction of propagation against a dispersive dielectric 1030 may shape a beam in a plurality of directions 1042 and 1044. With the lenz effect, the performance may be enhanced as shown in FIG. 11. FIG. 11 illustrates performance enhancement due to a lenz effect in a wireless communication device according to an embodiment of the present invention. Referring to FIG. 11, the gain about 11 dB improves in 0° direction.

Figure 12:
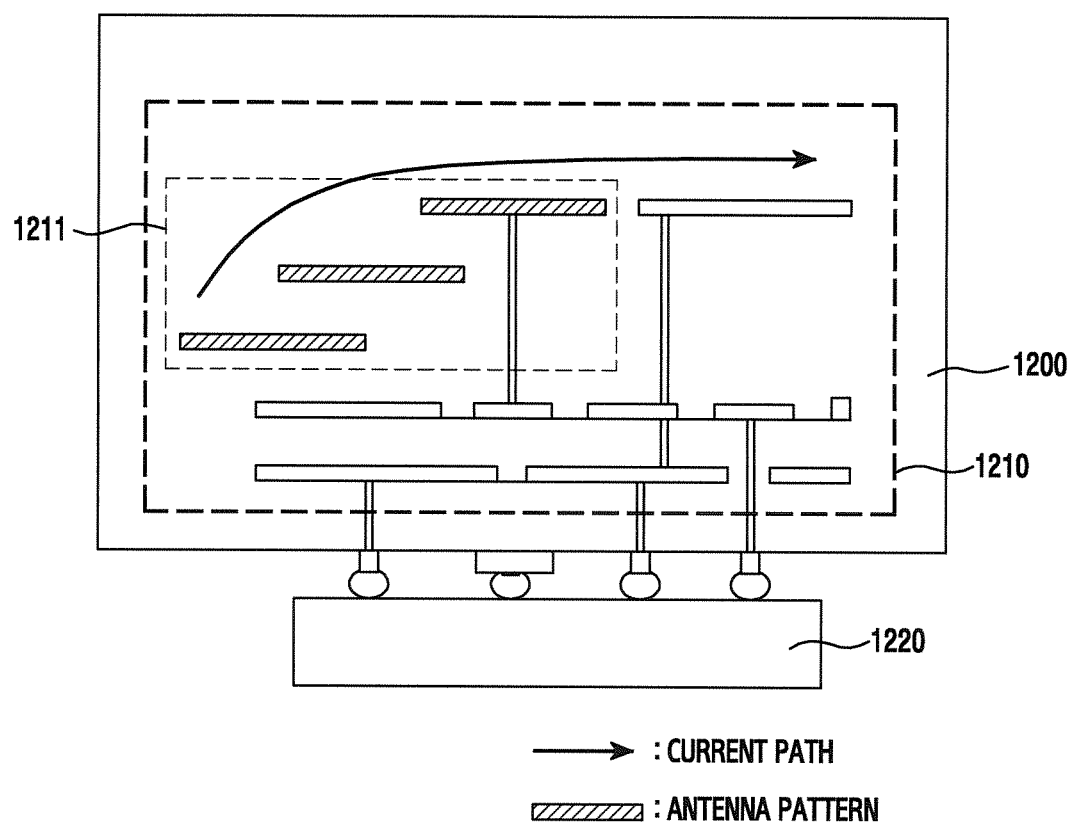
FIG. 12 illustrates an antenna package using a plurality of capacitively coupled patterns in a wireless communication device according to an embodiment of the present invention.

FIG. 12 illustrates an antenna package using a plurality of capacitively coupled patterns in a wireless communication device according to an embodiment of the present invention.

Referring to FIG. 12, the antenna package includes a board 1200, an antenna 1210, and an RFIC 1220, and the antenna 1210 is embedded in the board 1200. According to an embodiment of the present invention, the antenna 1210 includes capacitively coupled multi-patches 1211. The antenna 1210 of the structure of FIG. 12 is advantageous in matching and bandwidth tuning of a main antenna. As shown in FIG. 12, the multi-patches 1211 are spaced apart vertically without physical connections, but overlapped partially in a horizontal direction. The total length sum of the multi-patches 1211 in the horizontal direction determines the resonant frequency. Also, by controlling a main current path length due to the multi-patches 1211, an LC value of the antenna 1210 may be controlled. An area of the patches of the multi-patches 1211 overlapping in the horizontal direction determines a transmission rate of a signal.

Figure 13:
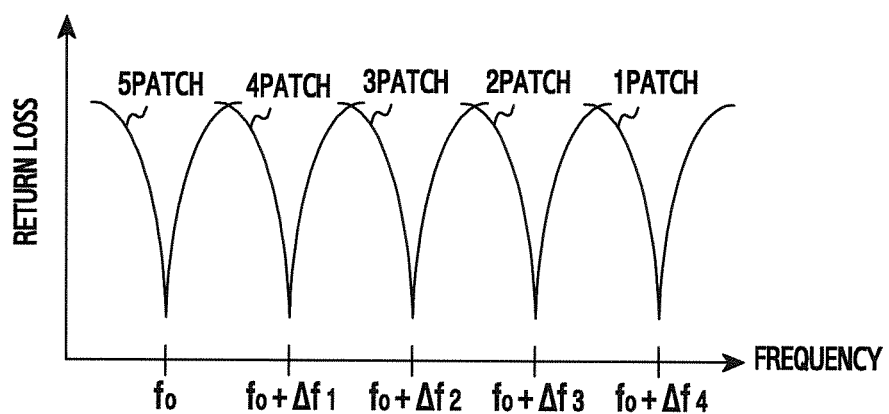
FIG. 13 illustrates performance change based on increase of multi-patches in a wireless communication device according to an embodiment of the present invention.

FIG. 13 illustrates performance change according to increase of multi-patches in a wireless communication device according to an embodiment of the present invention. When the number of patches forming the multi-patches 1211 increases, a length of a current path increases and thus the resonant frequency reduces. The resonant frequency may be expressed as a reciprocal of a square root of the LC value. FIG. 13 shows a return loss according to a frequency. A frequency having the smallest return loss is the resonant frequency. As shown in FIG. 13, as the number of the patches increases, the resonant frequency is reduced.

Figure 14:
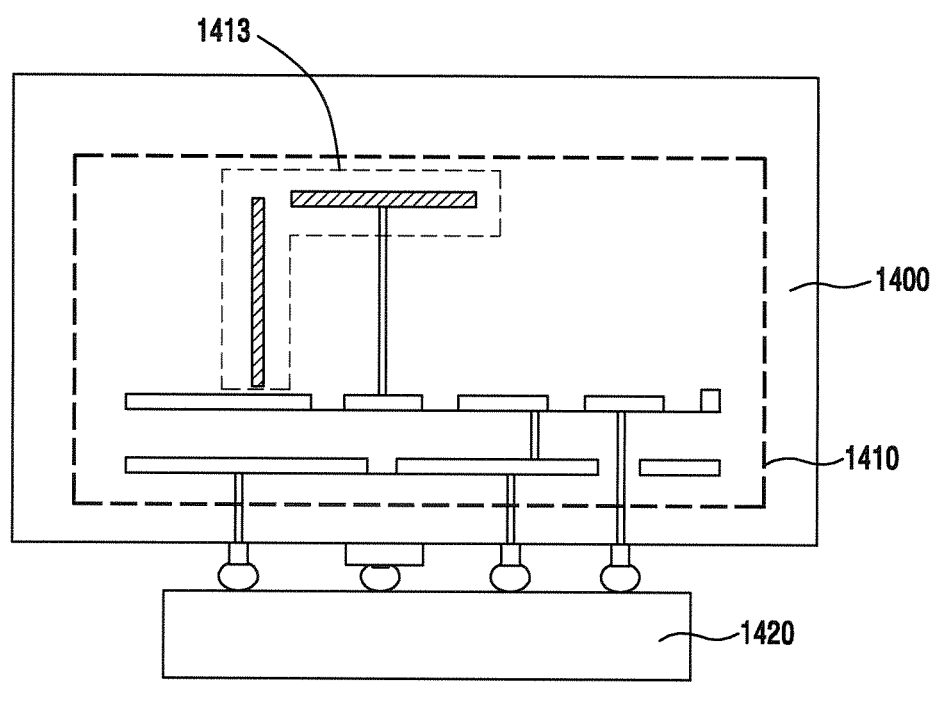
FIG. 14 illustrates an antenna package using patterns of different polarization characteristics in a wireless communication device according to an embodiment of the present invention.

FIG. 14 illustrates an antenna package using patterns of different polarization characteristics in a wireless communication device according to an embodiment of the present invention.

Referring to FIG. 14, the antenna package includes a board 1400, an antenna 1410, and an RFIC 1420, and the antenna 1410 is embedded in the board 1400. According to an embodiment of the present invention, the antenna 1410 includes a patch 1413 including parasitically coupled patterns for different polarizations. That is, the embodiment of FIG. 14 may enhance the polarization characteristic of the antenna 1410. The parasitically coupled patch 1413 may include the antenna patterns for at least two polarization characteristics of a vertical polarization, a horizontal polarization, and a circular polarization. An antenna with the vertical polarization needs to be installed perpendicularly to the ground and accordingly it is hard to apply to the antenna package according to the prior art. However, in the embodiment of the present invention, since the antenna 1410 is embedded in the board 1400, the antenna pattern may be formed in a vertical direction. When the board 1400 is perpendicular to the ground, the prior art has a similar problem with respect to the antenna having the horizontal polarization. However, the antenna package according to the embodiment of the present invention, in either case, may include both of the antenna of the vertical polarization and the antenna of the horizontal polarization.

Using different polarization characteristics, the antenna 1410 may be applied for the sake of space diversity or Multiple Input Multiple Output (MIMO) space diversity. That is, the patterns for the different polarization characteristics in the antenna 1410 may be used with different antennas. Hence, beam coverage may be extended.

In addition, since there are the antennas having the different polarization characteristics, an appropriate antenna may be selectively used according to the polarization characteristic of the antenna of other device. For example, when receiving a signal, the communication device may improve the reception performance by receiving the signal through an antenna matching the polarization characteristic of a transmit antenna of the other device. Similarly, when transmitting a signal, the communication device may improve the reception performance of the other device by transmitting the signal via an antenna of the same polarization characteristic as the antenna of the other device. That is, the polarization characteristic of the antenna affects the communication performance. The receive gain according to the polarization characteristic of the antenna is expressed as Equation 1.

$$\vec{T}1 = \hat{\rho}1 I_1$$

$$\vec{T}2 = \hat{\rho}2 I_2$$

$$\text{PLF} = |\hat{\rho}1 \cdot \hat{\rho}2|^2 = |\cos \phi|^2 = -10 \log 10(|\hat{\rho}1 \cdot \hat{\rho}2|^2) \quad \text{[Equation 1]}$$

Figure 15A:
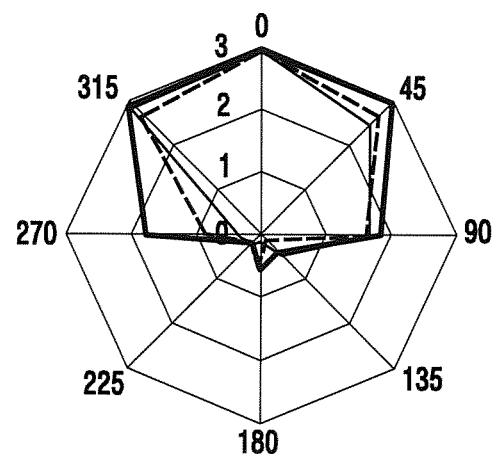
FIG. 15 illustrates gain change according to polarization characteristics in a wireless communication device according to an embodiment of the present invention.
Figure 15B:
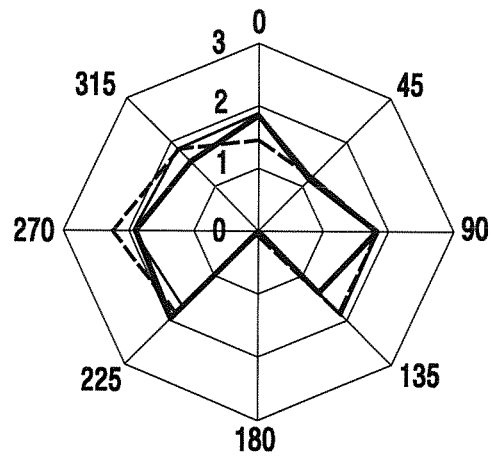

FIGS. 15A and 15B illustrate gain change according to polarization characteristics in a wireless communication device according to an embodiment of the present invention. FIG. 15A shows the gain in case of co-polarization between two communicating devices, and FIG. 15B shows the gain in case of cross-polarization between two communicating devices. Comparing FIG. 15A and FIG. 15B, for the cross-polarization, a low gain exhibits in 0° direction and a high gain exhibits in 90° through 270°, that is, in unintended directions. That is, the gain is much higher in case of the co-polarization.

FIG. 15 illustrates gain change according to polarization characteristics in a wireless communication device according to an embodiment of the present invention. FIG. 15A shows the gain in case of co-polarization between two communicating devices, and FIG. 15B shows the gain in case of cross-polarization between two communicating devices. Comparing FIG. 15A and FIG. 15B, for the cross-polarization, a low gain exhibits in 0° direction and a high gain exhibits in 90° through 270°, that is, in unintended directions. That is, the gain is much higher in case of the co-polarization.

Figure 16:
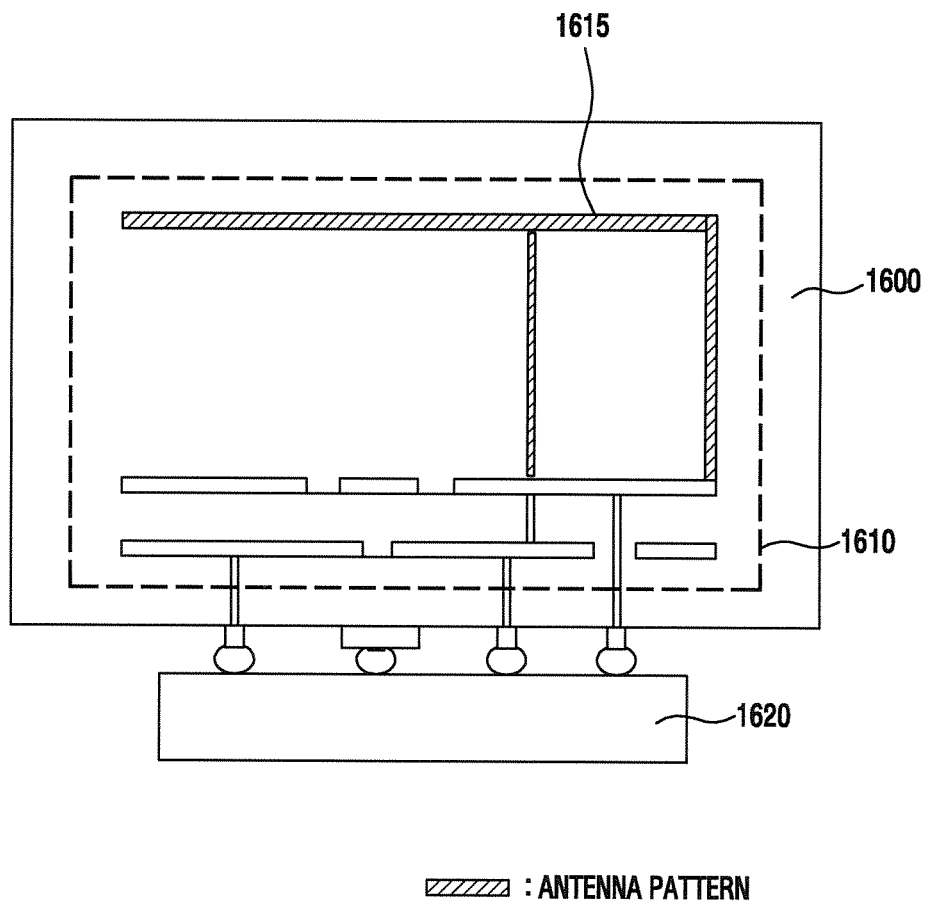
FIG. 16 illustrates an antenna package using an Inverted-F Antenna (IFA) pattern in a wireless communication device according to an embodiment of the present invention.

FIG. 16 illustrates an antenna package using an Inverted-F Antenna (IFA) pattern in a wireless communication device according to an embodiment of the present invention.

Referring to FIG. 16, the antenna package includes a board 1600, an antenna 1610, and an RFIC 1620, and the antenna 1610 is embedded in the board 1600. According to an embodiment of the present invention, the antenna 1610 includes an IFA pattern 1615. That is, the antenna package according to an embodiment of the present invention may include the embedded IFA 1615. Further, in the prior art, the antenna pattern protrudes above the board 1600 and thus the IFA pattern 1615 cannot be installed vertically as shown in FIG. 16. That is, the antenna package according to an embodiment of the present invention may include the IFA pattern 1615 installed vertically.

Figure 17:
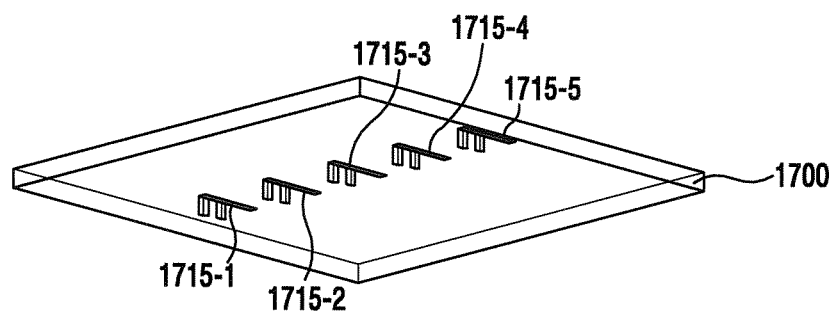
FIG. 17 illustrates an example of an array antenna configuration in a wireless communication device according to an embodiment of the present invention.
Figure 18A:
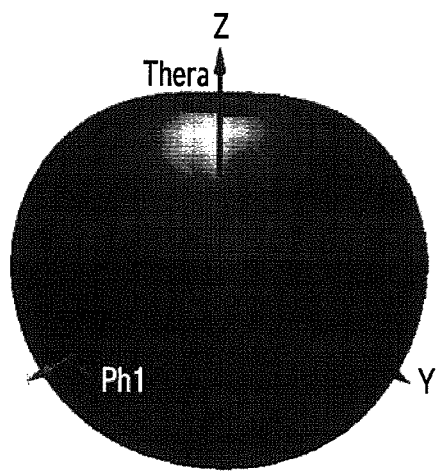
FIG. 18 illustrates examples of a radiation pattern using an array antenna in a wireless communication device according to an embodiment of the present invention.
Figure 18B:
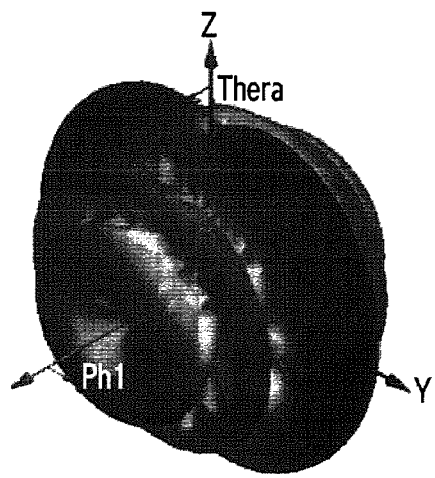

Further, an array antenna using an IFA may be configured as shown in FIG. 17. FIG. 17 illustrates an example of an array antenna configuration in a wireless communication device according to an embodiment of the present invention. Referring to FIG. 17, a plurality of IFA patterns 1715-1 through 1715-5 is arranged in a board 1700. A radiation pattern of FIG. 18 may be generated from the array antenna of FIG. 18. FIG. 18 illustrates examples of a radiation pattern using an array antenna in a wireless communication device according to an embodiment of the present invention. FIG. 18A shows a radiation pattern of a single IFA, and FIG. 18B shows a radiation pattern of a 1×N IFA array antenna. That is, by configuring the array antenna of the IFA, the gain is improved and the beamforming may be realized.

Figure 19:
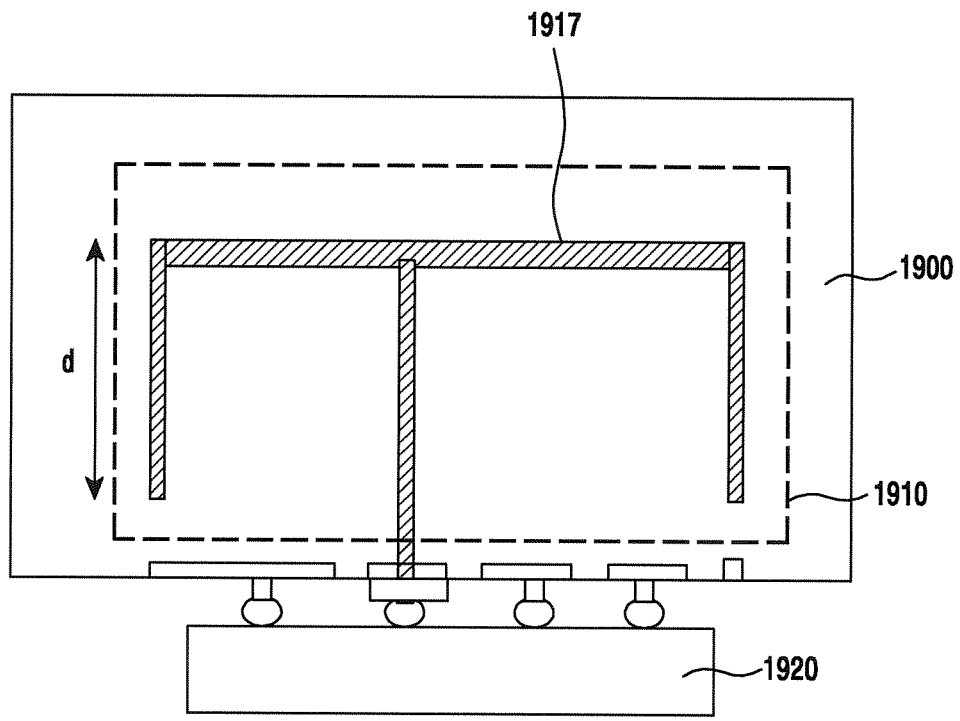
FIG. 19 illustrates an antenna package using a dipole pattern in a wireless communication device according to an embodiment of the present invention.

FIG. 19 illustrates an antenna package using a dipole pattern in a wireless communication device according to an embodiment of the present invention.

Referring to FIG. 19, the antenna package includes a board 1900, an antenna 1910, and an RFIC 1920, and the antenna 1910 is embedded in the board 1600. According to an embodiment of the present invention, the antenna 1910 includes an embedded dipole pattern 1917. That is, the antenna package according to an embodiment of the present invention may include the embedded dipole antenna 1917. The embedded dipole pattern 1917 may be implemented using a copper pattern and a via in various shapes Further, in the prior art, the antenna pattern protrudes above the board 1900 and accordingly the dipole pattern 1917 cannot be installed vertically as shown in FIG. 19. That is, the antenna package according to an embodiment of the present invention may include the dipole pattern 1917 installed vertically.

Figure 20:
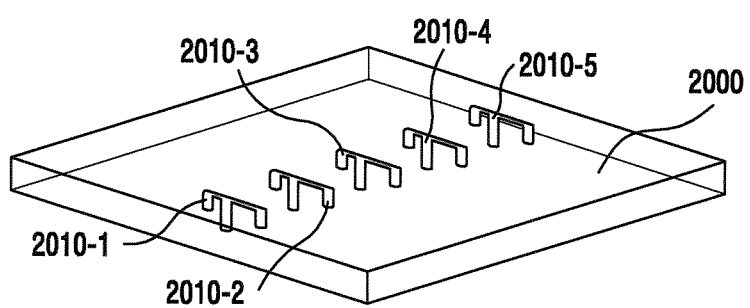
FIG. 20 illustrates an example of an array antenna configuration in a wireless communication device according to an embodiment of the present invention.

Further, an array antenna using a dipole antenna may be configured as shown in FIG. 20. FIG. 20 illustrates an example of an array antenna configuration in a wireless communication device according to an embodiment of the present invention. Referring to FIG. 20, a plurality of dipole antennas 2017-1 through 2017-5 is disposed in a board 2000. The array antenna of FIG. 20 may realize an adaptive omni or directional beam pattern. Further, a frequency may be turned by adjusting a length d of the embedded dipole pattern 1917. In addition, an antenna volume may be maintained using a height of the board 2000, and thus miniaturization may be realized.

Figure 21:
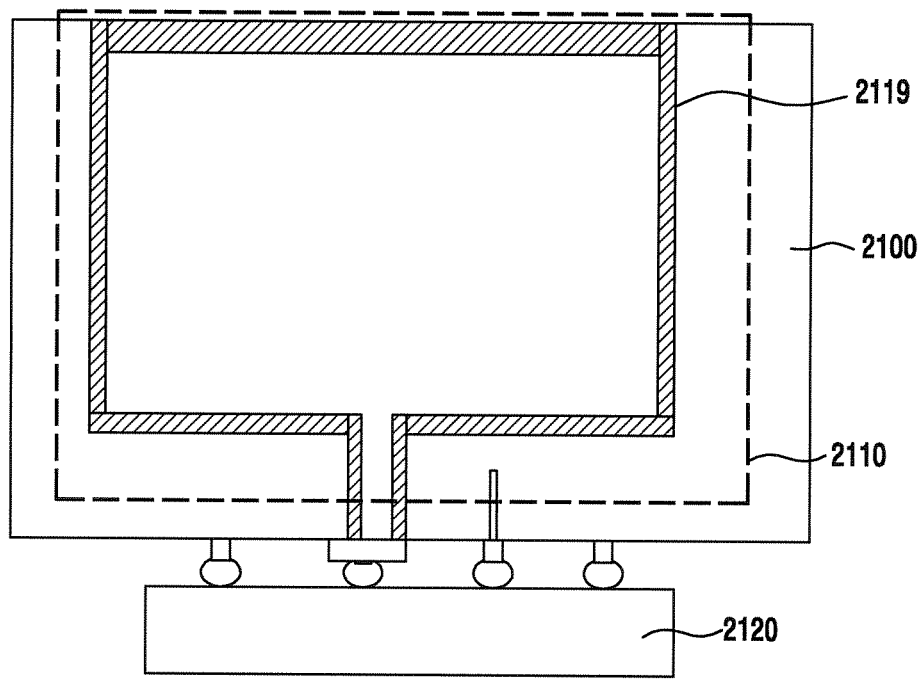
FIG. 21 illustrates an antenna package using a loop antenna pattern in a wireless communication device according to an embodiment of the present invention.

FIG. 21 illustrates an antenna package using a loop antenna pattern in a wireless communication device according to an embodiment of the present invention.

Figure 22A:
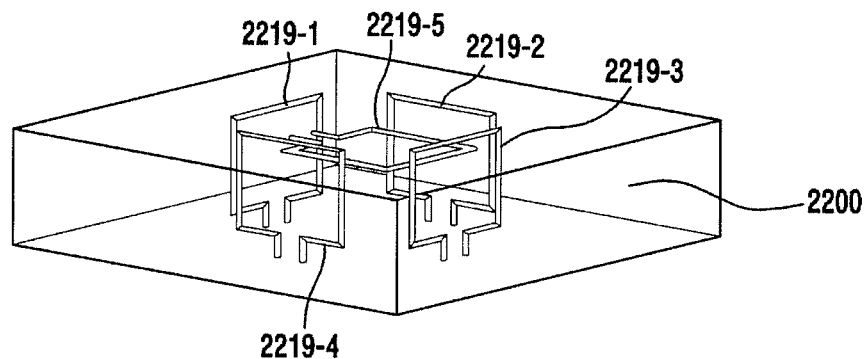
FIGS. 22A and 22B illustrate an example of an array antenna configuration in a wireless communication device according to an embodiment of the present invention.
Figure 22B:
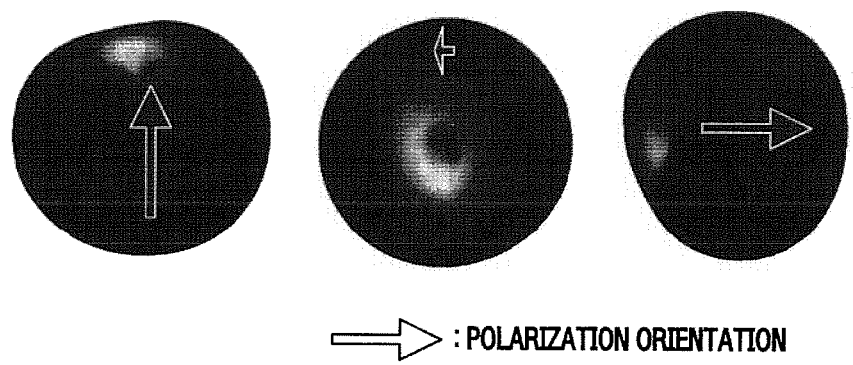
Figure 23:
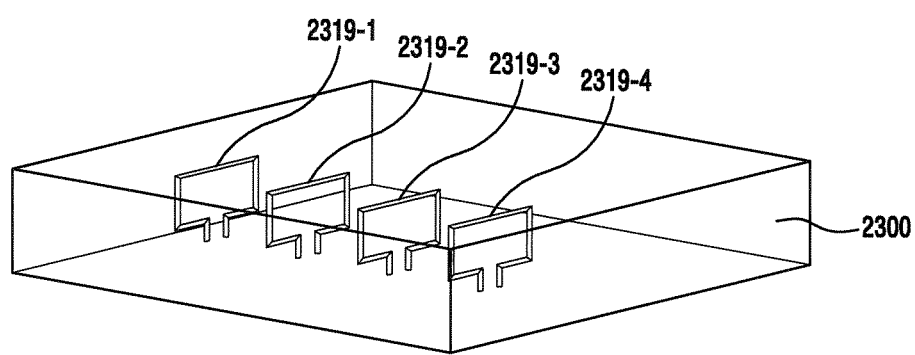
FIG. 23 illustrates another example of an array antenna configuration in a wireless communication device according to an embodiment of the present invention.

Further, as shown in FIGS. 22A and 22B or FIG. 23, an array antenna using a loop antenna may be configured. FIGS. 22A and 22B illustrate an example of an array antenna configuration in a wireless communication device according to an embodiment of the present invention. Referring to FIG. 22A, a plurality of loop antennas 2219-1 through 2219-5 is disposed in a board 2200. A radiation pattern of FIG. 22B may be generated from the array antenna of FIG. 22A. That is, a beam pattern and a polarization characteristic may be adjusted freely by arranging the loop antennas in a three-dimensional space freely using the x axis, the y axis, and the z axis. Further, 360° coverage may be achieved and the polarization characteristic may be enhanced. FIG. 23 illustrates another example of an array antenna configuration in a wireless communication device according to an embodiment of the present invention. As shown in FIG. 23, unlike FIG. 22, the loop antennas 2319-1 through 2319-4 may be arranged inside a board 2300 in one-dimensional arrangement.

Further, as shown in FIG. 22 or FIG. 23, an array antenna using a loop antenna may be configured. FIG. 22 illustrates an example of an array antenna configuration in a wireless communication device according to an embodiment of the present invention. Referring to FIG. 22A, a plurality of loop antennas 2219-1 through 2219-5 is disposed in a board 2200. A radiation pattern of FIG. 22B may be generated from the array antenna of FIG. 22A. That is, a beam pattern and a polarization characteristic may be adjusted freely by arranging the loop antennas in a three-dimensional space freely using the x axis, the y axis, and the z axis. Further, 360° coverage may be achieved and the polarization characteristic may be enhanced. FIG. 23 illustrates another example of an array antenna configuration in a wireless communication device according to an embodiment of the present invention. As shown in FIG. 23, unlike FIG. 22, the loop antennas 2319-1 through 2319-4 may be arranged inside a board 2300 in one-dimensional arrangement.

Figure 24:
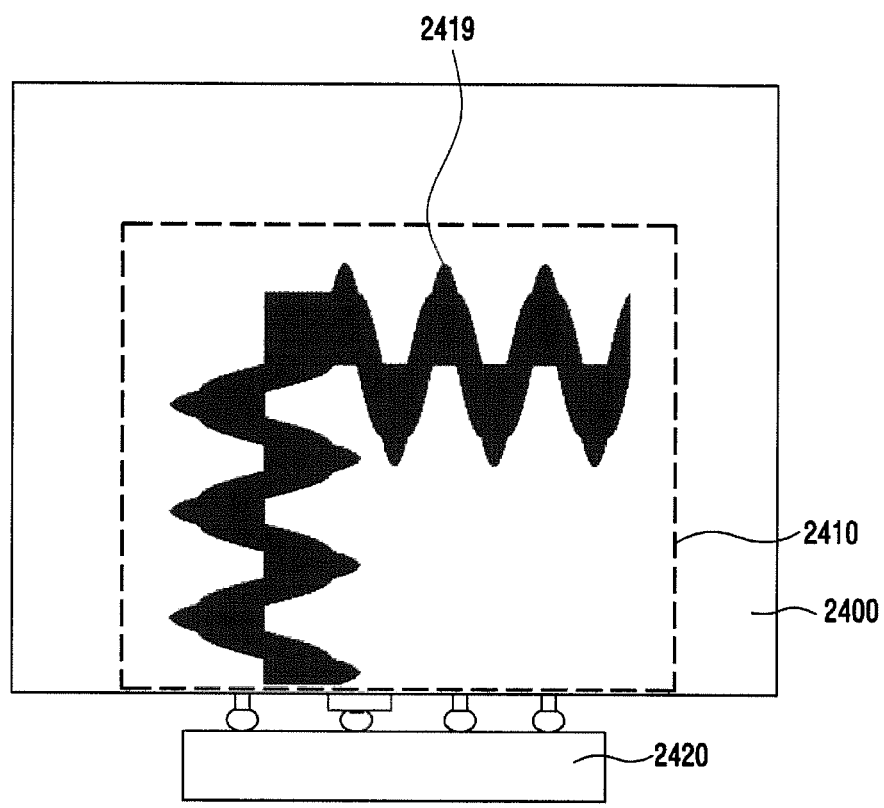
FIG. 24 illustrates an antenna package using a helical antenna pattern in a wireless communication device according to an embodiment of the present invention.

FIG. 24 illustrates an antenna package using a helical antenna pattern in a wireless communication device according to an embodiment of the present invention.

Referring to FIG. 24, the antenna package includes a board 2400, an antenna 2410, and an RFIC 2420, and the antenna 2410 is embedded in the board 2400. According to an embodiment of the present invention, the antenna 2410 includes a helical antenna pattern 2419. That is, the antenna package according to an embodiment of the present invention may include the embedded helical antenna pattern 2419. Generally, the helical antenna requires a pole for supporting a helical conductor. However, the antenna 2410 according to an embodiment of the present invention is embedded in a board 2420 and accordingly does not require a separate pole.

Figure 25A:
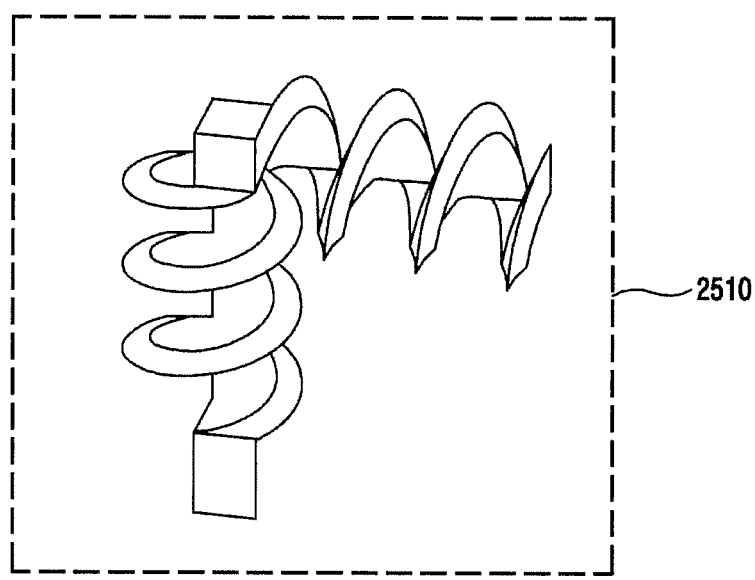
FIGS. 25A and 25B illustrate a radiation pattern of a single helical pattern in a wireless communication device according to an embodiment of the present invention.
Figure 25B:
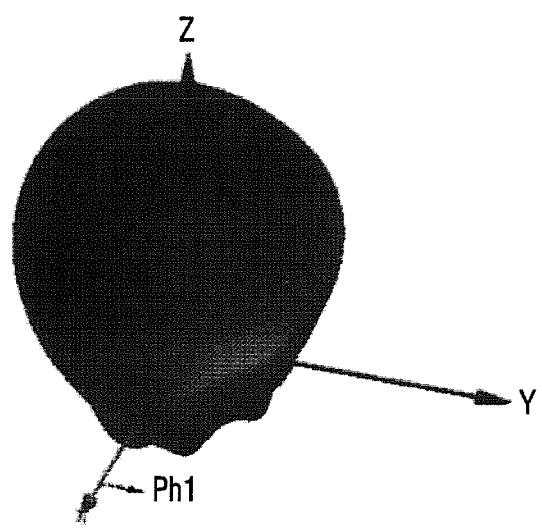
Figure 26A:
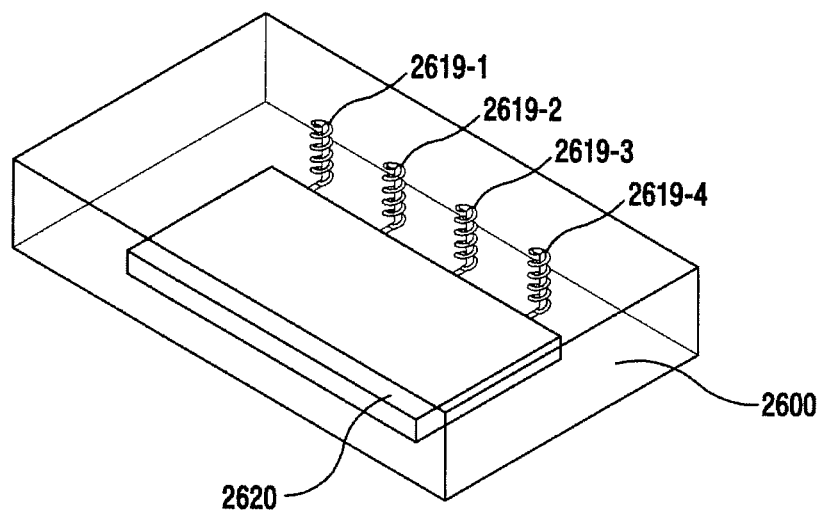
FIGS. 26A and 26B illustrate an example of an array antenna configuration in a wireless communication device according to an embodiment of the present invention.
Figure 26B:
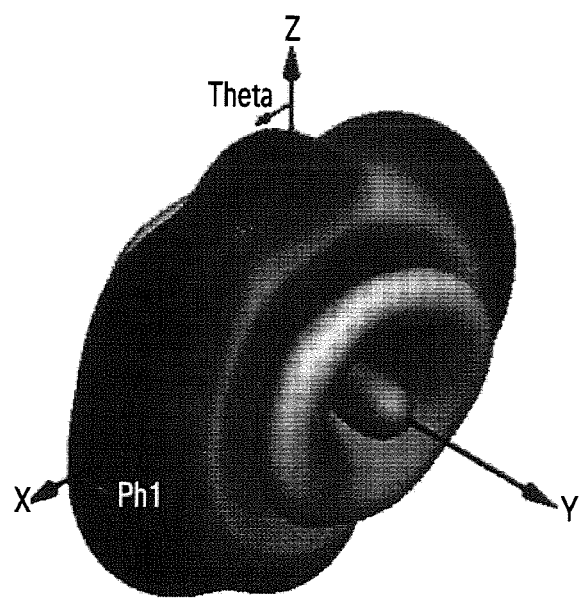

FIGS. 25A and 25B illustrate a radiation pattern of a single helical pattern in a wireless communication device according to an embodiment of the present invention. Referring to FIG. 25, the single helical pattern may form a radiation pattern of the strongest electric field along the z axis. An example of an array antenna using the embedded helical antenna 2149 is shown in FIG. 26. FIGS. 26A and 26B illustrate an example of an array antenna configuration in a wireless communication device according to an embodiment of the present invention. Referring to FIG. 26A, a plurality of helical antennas 2619-1 through 2619-5 is connected to an RFIC 2620 and disposed in a board 2600. The array antenna of FIG. 25A may generate a radiation pattern of FIG. 26B. That is, a beam pattern and a polarization characteristic may be adjusted freely by arranging the loop antennas in a three-dimensional space freely using the x axis, the y axis, and the z axis. Further, 360° coverage may be achieved and the polarization characteristic may be enhanced.

In the specific embodiments of the present invention, the elements included in the invention are expressed in a singular or plural form according to the suggested specific embodiment. However, the singular or plural expression is appropriately selected according to a proposed situation for the convenience of explanation and the present invention is not limited to a single element or a plurality of elements. The elements expressed in the plural form may be configured as a single element and the elements expressed in the singular form may be configured as a plurality of elements.

While the specific embodiment has been described in the specification of the present invention, it will be understood that various changes may be made therein without departing from the scope of the present. Therefore, the scope of the invention is not limited to the described embodiments but is defined by the scope of the claims to be explained and their equivalents.

The invention claimed is:

1. An antenna package in an electronic device, the antenna package comprising:
   a board configured with a stack structure including a highest layer, a lowest layer, and at least one intermediate layer; and
   an antenna including at least one antenna pattern embedded between the highest layer and the lowest layer within the board,
   wherein the highest layer comprises a dispersive dielectric portion having different permittivity from other portions of the board so that a radio frequency (RF) signal from the at least one antenna pattern is radiated through the dispersive dielectric portion towards an upper board direction with beam shaping,
   wherein at least one pad is disposed on a lower surface of the lowest layer to be electrically directly coupled to at least one ball of a radio frequency integrated circuit (RFIC), and
   wherein at least one conductive via is disposed from the lowest layer to the antenna so that the at least one pad is electrically connected with the at least one antenna pattern for radiating the RF signal.

2. The antenna package of claim 1, wherein the dispersive dielectric portion is configured in a periodic structure comprising a plurality of unit cells.

3. The antenna package of claim 2, wherein the plurality of unit cells is configured to refract the RF signal in a plurality of directions with beam shaping.

4. The antenna package of claim 2, wherein the plurality of unit cells is disposed in a direction associated with a gain increase and at a predefined interval.

5. The antenna package of claim 4, wherein the predefined interval has a fixed value smaller than a wavelength of an operating frequency.

6. The antenna package of claim 1, further comprising:
   at least one second antenna, wherein the at least one second antenna is of a different frequency band from the at least one antenna pattern and is disposed on an upper surface of the highest layer, and
   a heat sink disposed on the upper surface of the highest layer.

7. The antenna package of claim 1, wherein the at least one antenna pattern comprises a plurality of capacitively coupled patches,
   wherein the plurality of capacitively coupled patches is spaced apart vertically in a vertical plane without physical connections and overlap partially in a horizontal plane, and
   wherein as the plurality of capacitively coupled patches increases in number, a resonant frequency of the at least one antenna pattern reduces.

8. The antenna package of claim 7, wherein a beam pattern of the antenna package is controlled by the dispersive dielectric portion according to a change of a resonant frequency.

9. The antenna package of claim 7, wherein plurality of unit cells includes a passive element that controls a beam pattern of the antenna package according to a change of a resonant frequency.

10. The antenna package of claim 1, wherein the at least one antenna pattern comprises a plurality of parasitically coupled patches configured to have different polarization characteristics, and
    wherein at least one of the plurality of parasitically coupled patches is configured vertically in the board such that the at least one of the plurality of parasitically coupled patches is perpendicular to a horizontal ground plane.

* * * * *